United States Patent [19]

Schrenker et al.

[11] Patent Number: 6,093,913
[45] Date of Patent: Jul. 25, 2000

[54] ELECTRICAL HEATER FOR CRYSTAL GROWTH APPARATUS WITH UPPER SECTIONS PRODUCING INCREASED HEATING POWER COMPARED TO LOWER SECTIONS

[75] Inventors: Richard G. Schrenker, Chesterfield; William L. Luter, St. Charles, both of Mo.

[73] Assignee: MEMC Electronic Materials, Inc, St. Peters, Mo.

[21] Appl. No.: 09/092,391

[22] Filed: Jun. 5, 1998

[51] Int. Cl.$^7$ .................................................. C30B 35/00
[52] U.S. Cl. ........................ 219/424; 219/552; 117/217; 117/222
[58] Field of Search .................................... 219/424, 422, 219/426, 552, 553; 373/117, 118, 134; 117/217, 222; 118/726

[56] References Cited

U.S. PATENT DOCUMENTS

| | | | |
|---|---|---|---|
| 3,359,077 | 12/1967 | Arst | 117/217 |
| 3,860,736 | 1/1975 | Ford | 373/113 |
| 4,410,796 | 10/1983 | Wilsey | 219/553 |
| 4,533,822 | 8/1985 | Fujii et al. | 219/553 |
| 4,748,315 | 5/1988 | Takahashi et al. | 373/118 |
| 4,813,373 | 3/1989 | Demay et al. | 118/726 |
| 4,910,383 | 3/1990 | Zimmer | 219/233 |
| 5,132,091 | 7/1992 | Azad . | |
| 5,137,699 | 8/1992 | Azad . | |
| 5,766,347 | 6/1998 | Shimomura et al. | 117/217 |
| 5,911,825 | 6/1999 | Groat et al. | 117/217 |
| 5,968,266 | 10/1999 | Iino et al. | 117/217 |

FOREIGN PATENT DOCUMENTS

| | | |
|---|---|---|
| 798 404 | 10/1997 | European Pat. Off. . |
| 60-155594 | 8/1985 | Japan . |
| 62-167286 | 7/1987 | Japan . |
| 62-223090 | 10/1987 | Japan . |
| 5-043385 | 2/1993 | Japan . |
| 6-036368 | 2/1994 | Japan . |
| 6-345595 | 12/1994 | Japan . |
| 5-43385 | 1/1998 | Japan . |
| 4-305087 | 10/1992 | Jordan . |

*Primary Examiner*—John A. Jeffery
*Attorney, Agent, or Firm*—Senniger, Powers, Leavitt & Roedel

[57] ABSTRACT

An electrical resistance heater for use in a crystal puller used for growing monocrystalline silicon ingots according to the Czochralski method comprises a heating element sized and shaped for disposition in the housing of the crystal puller around the crucible for applying heat to the crucible and silicon therein. The heating element includes heating segments connected together in an electric circuit. The segments have upper and lower sections and are arranged relative to each other so that when disposed around the crucible containing molten silicon the upper sections are disposed generally above a horizontal plane including the surface of the molten silicon and the lower sections are disposed generally below the horizontal plane. The upper sections are constructed to generate more heating power than the lower sections thereby to reduce a temperature gradient between the molten silicon at its surface and the ingot just above the surface of the molten silicon. The upper sections have a thickness substantially equal to the thickness of the lower sections and have a width substantially less than the width of the lower sections. The cross-sectional area of the upper sections is everywhere less than the cross-sectional area of the lower sections.

11 Claims, 2 Drawing Sheets

ELECTRICAL HEATER FOR CRYSTAL GROWTH APPARATUS WITH UPPER SECTIONS PRODUCING INCREASED HEATING POWER COMPARED TO LOWER SECTIONS

The present invention relates generally to crystal growing apparatus used in growing monocrystalline silicon ingots, and more particularly to an electrical resistance heater for such crystal growing apparatus.

Monocrsytalline silicon, which is the starting material for most processes for the fabrication of semiconductor electronic components, is commonly prepared by the so-called Czochralski ("Cz") method. The growth of the crystal is carried out in a crystal pulling furnace. In this method, polycrystalline silicon ("polysilicon") is charged to a crucible and melted via a heater surrounding the outer surface of the crucible side wall. A seed crystal is brought into contact with the molten silicon in the crucible and a single crystal ingot is grown by slow extraction via a crystal puller. After formation of a neck is complete, the diameter of the crystal ingot is enlarged by decreasing the pulling rate and/or the melt temperature until the desired or target diameter is reached. The cylindrical main body of the ingot, which has an approximately constant diameter, is then grown by controlling the pull rate and the melt temperature while compensating for the decreasing melt level in the crucible. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

Heaters used for melting silicon in the crucible are typically electrical resistance heaters in which electrical current flows through a heating element constructed of a resistive heating material (e.g., graphite). The resistance to the flow of current generates heat that radiates from the heating element to the crucible and silicon contained therein. The heating element comprises vertically oriented heating segments arranged in side-by-side relationship and connected to each other to define a serpentine configuration. That is, adjacent segments are connected to each other at the tops or bottoms of the segments in an alternating manner to form a continuous electrical circuit throughout the heating element. The serpentine configuration is formed by cutting (i.e., sawing) vertically extending slots into a tube constructed of the electrically resistive material. The downward and upward extending slots alternatingly extend from the top of the heating element to just short of the bottom, where the bottoms of adjacent segments are connected, and from the bottom of the heating element to just short of the top, where the tops of adjacent segments are connected. The heating power generated by the heating element is generally a function of the cross-sectional area of the segments.

Although the conventional apparatus used for growing single crystal silicon according to the Czochralski growth method has been satisfactory for growing crystal ingots useful in a wide variety of applications, further improvements in the quality of the semiconductor material are desirable. As the width of integrated circuit lines formed on the semiconductor material are reduced, the presence of defects in the crystal become of greater concern. A number of defects in single crystal silicon form in the crystal growth chamber as the crystal cools after solidification. Such defects arise, in part, because of the presence of an excess (i.e., a concentration above the solubility limit) of intrinsic point defects, which are known as vacancies and self-interstitials. Vacancies, as their name suggests, are caused by the absence or "vacancy" of a silicon atom in the crystal lattice. Self-interstitials are produced by the presence of an extra silicon atom in the lattice. Both kinds of defects adversely affect the quality of the semiconductor material.

Silicon crystals grown from a melt are typically grown with an excess of one or the other type of intrinsic point defect, either crystal lattice vacancies or silicon self-interstitials. It is understood that the type and initial concentration of these point defects in the silicon, which become fixed at the time of solidification, are controlled by the ratio $v/G_0$, where v is the growth velocity or pull rate of the crystal and $G_0$ is the instantaneous axial temperature gradient in the crystal at the time of solidification (e.g., at the liquid-solid interface). As the value of $v/G_0$ exceeds a critical value, the concentration of vacancies increases. Likewise, as the value of $v/G_0$ falls below the critical value, the concentration of self-interstitials increases.

One difficulty in controlling the ratio $v/G_0$ results from the non-uniformity of the axial temperature gradient of the crystal at the liquid-solid interface. In the conventional crystal pulling apparatus described above, the side wall of the crucible extends substantially above the surface level, or melt surface, of the molten silicon contained in the crucible. The height of the exposed side wall above the melt surface increases as the volume of molten silicon in the crucible decreases upon solidification of the silicon. The portion of the crucible side wall extending above the melt surface is exposed to the cooler walls of the crystal puller so that heat radiates from the crucible to the crystal puller walls, thereby cooling this upper crucible portion. The higher above the melt surface the exposed portion is, the cooler it gets. This cooling of the crucible, as well as exposure of the ingot to the cooler walls of the crystal puller, results in heat radiating from the portion of the crystal ingot above the melt surface, causing cooling of the ingot as it is pulled upward from the molten silicon.

In contrast, the crystal ingot cools at a much slower rate along its central axis (which is not exposed to the crucible or crystal puller walls) than on the outer surface of the ingot, resulting in a substantially reduced axial temperature gradient at the center of the crystal in comparison to the axial temperature gradient at the outer surface of the crystal. Thus, the ratio $v/G_0$ is substantially greater at the center of the crystal than at the outer surface, causing increased non-uniformity and number density of the point defects in the crystal. The axial temperature gradients associated with cooling of the crucible side wall also result in axial temperature gradients of the susceptor in which the crucible is held. This can lead to a shortened structural lifetime of the susceptor, thereby requiring more frequent replacement.

It has been determined that the introduction of point vacancies in the crystal at the liquid-solid interface can be effectively controlled by reducing the differential between the axial temperature gradient at the central axis of the crystal and the axial temperature gradient at the outer surface. More particularly, by reducing the axial temperature gradients in the crucible side wall above the melt surface, the cooling rate of the outer surface of the crystal at the liquid-solid interface can be decreased so that the temperature gradient at the outer surface of the crystal is substantially reduced, thereby reducing the differential between the respective axial temperature gradients at the central axis and the outer surface of the crystal.

Many of the existing heaters, described above, are insufficient for achieving this objective. These heaters are constructed so that a lower section of each segment of the heating element is generally below the crucible for mounting the heater on the bottom of the furnace and an upper section is adjacent the side wall of the crucible. One disadvantage of these heaters is that the top of the heating element is exposed to the cooler walls of the crystal puller while the bottom is more insulated. This results in a temperature gradient between the top and bottom of the heating element, with the heat generated at the top of the heating element being less than the heat generated at the center or bottom of the heating element. In addition, the cross-sectional area of the segments is increased at the top of the heating element where adjacent segments are connected to maintain the structural integrity of the heating element. This increase in cross-sectional area decreases the electrical resistance, thereby reducing the power output at the top of the heating element and resulting in an inability to adequately heat the portion of the crucible wall above the melt surface to reduce the radiation of heat from the ingot.

U.S. Pat. Nos. 5,137,699 (Azad) and 4,604,262 (Nishizawa) disclose the use of one or more supplemental heaters for augmenting the conventional crucible heater to heat the crucible wall as it extends above the melt surface. However, the supplemental heaters disclosed in these patents are independent from the conventional heater and require additional controls for controlling their operation. Use of these separate heaters also requires additional space in the crucible, additional energy to operate, and are likely costly to manufacture and install in the housing of the furnace.

It also known to increase the electrical resistance toward the top of the heating element by gradually reducing (e.g., by tapering inward) the thickness of the segments along the upper sections of the segments. This reduces the cross-sectional area of the segments toward the top of the heating element, thereby increasing the resistance of the segments to generate increased heating power at the top of the heating element. However, reducing the thickness of the segments in this manner can reduce the structural integrity of the upper sections of the segments, thereby increasing the risk of mechanical failure of the heater. For example, while the slots in the heater are being cut, bending stresses are applied to the upper sections of the segments. With the thickness of the upper sections reduced, there is a greater likelihood that the bending stresses will induce a fracture of the segment within the area of reduced thickness. In crystal pullers in which a cross-magnet is used in the crystal growth chamber of the puller to promote crystal growth, the magnetic field created by the magnet pulls against the electrically charged heating element, creating bending stresses in the upper sections of the segments that can induce a fracture of the segment within the area of reduced thickness. Additional bending stresses are caused by the weight of the heating element.

It is also known to gradually increase the width of the upward and downward extending slots between adjacent segments generally along the upper sections of the segments. This reduces the cross-sectional area of the segments to generate increased power at the top of the heating element. However, the increased width of the upward extending slots creates substantially narrowed portions of the upper sections. These narrowed portions create cross-sectional areas that are substantially less than the cross-sectional areas of the upper sections above the narrowed portion. Bending stresses in the upper sections, such as stresses caused by cutting of the slots, by magnetic fields generated in the growth chamber of the crystal puller, and by the weight of the heating element itself are thus concentrated at the narrowed portions, increasing the risk of fracture. Moreover, in an attempt to reduce this risk, the upward extending slot terminates well short of the top of the heating element, leaving a substantially increased cross-sectional area of the segment above the narrowed portion (e.g., greater than the cross-sectional area of the lower section of the segment below the narrowed portion), resulting in substantial heating power loss at the top of the heater.

SUMMARY OF THE INVENTION

Among the several objects and features of the present invention may be noted the provision of an electrical resistance heater for use in a crystal puller which facilitates the growth of low defect monocrystalline silicon ingots in the puller; the provision of such a heater which reduces the difference between the axial temperature gradients at the outer surface of the ingot and the central axis of the ingot; the provision of such a heater which provides a more uniform crucible side wall temperature; the provision of such a heater which has improved structural strength; the provision of such a heater which is efficient to operate; and the provision of such a heater which is easy to install in the crystal puller.

Generally, an electrical resistance heater of the present invention for use in a crystal puller used for growing monocrystalline silicon ingots according to the Czochralski method comprises a heating element sized and shaped for disposition in the housing of the crystal puller around the crucible for applying heat to the crucible and silicon therein. The heating element includes heating segments connected together in an electric circuit. The segments have upper and lower sections and are arranged relative to each other so that when disposed around the crucible containing molten silicon the upper sections are disposed generally above a horizontal plane including the surface of the molten silicon and the lower sections are disposed generally below the horizontal plane. The upper sections are constructed to generate more heating power than the lower sections thereby to reduce a temperature gradient between the molten silicon at its surface and the ingot just above the surface of the molten silicon. The upper sections have a thickness substantially equal to the thickness of the lower sections and have a width substantially less than the width of the lower sections. The cross-sectional area of the upper sections is everywhere less than the cross-sectional area of the lower sections.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
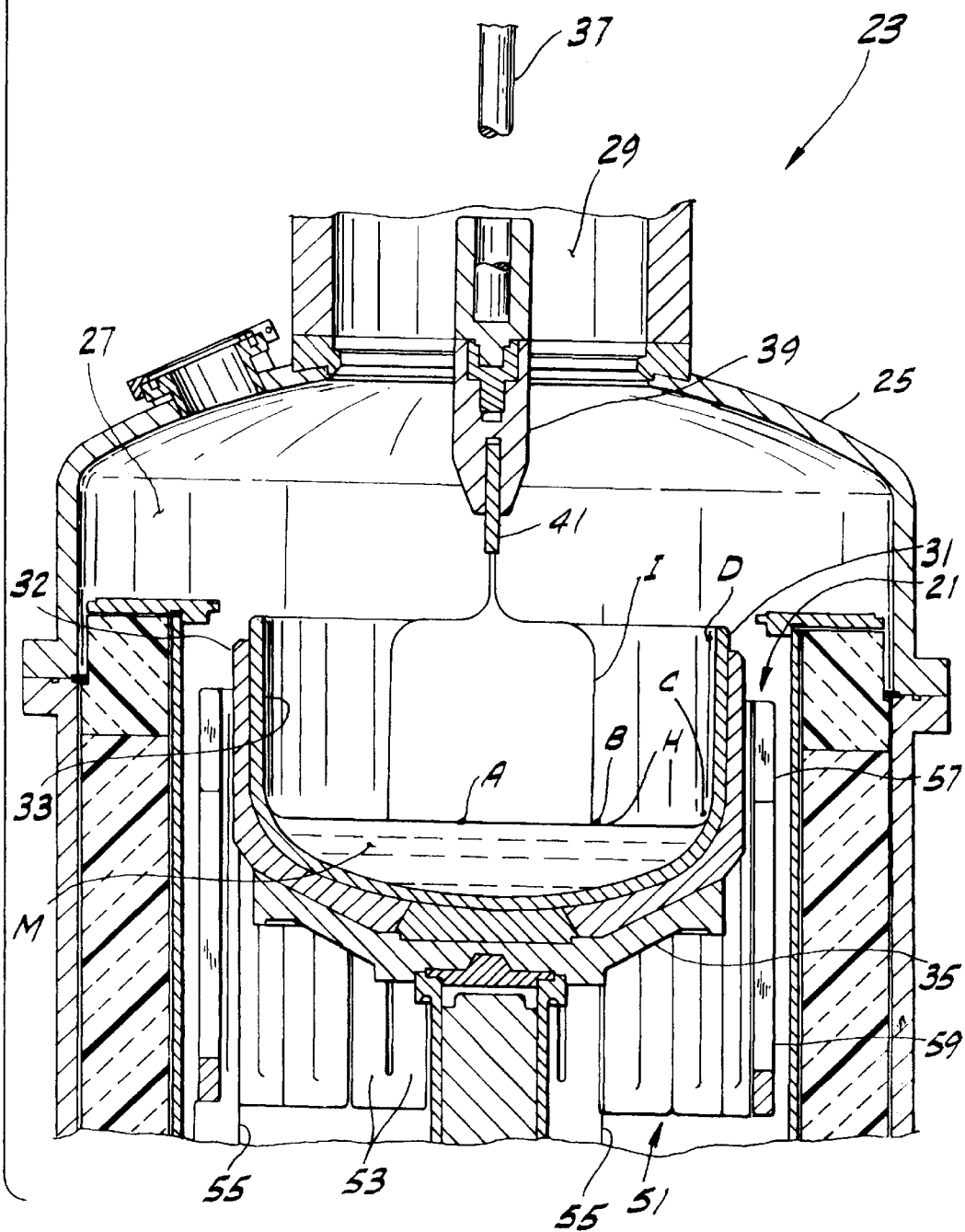
FIG. 1 is a schematic, fragmentary vertical section of a crystal puller showing an electrical resistance heater of the present invention as it is positioned during growth of a single crystal silicon ingot.

Referring now to the drawings and in particular to FIG. 1, an electrical resistance heater constructed according to the principles of the present invention is generally indicated at 21. The heater 21 is installed in a crystal puller, indicated generally at 23, of the type used to grow monocrystalline silicon ingots (e.g., ingot I of FIG. 1) according to the Czochralski method. The crystal puller 23 includes a housing, generally indicated at 25, for isolating an interior which includes a lower crystal growth chamber 27 and an upper pull chamber 29. The pull chamber 29 has a smaller transverse dimension than the growth chamber 27. A quartz crucible 31 seated in a susceptor 32 contains molten semiconductor source material M from which the monocrystalline silicon ingot I is grown. The crucible 31 includes a cylindrical side wall 33 and is mounted on a turntable 35 for rotation about a central axis X. The crucible 31 is also capable of being raised within the growth chamber 27 to maintain the surface of the molten source material M at a generally constant level, or horizontal plane H, as the ingot I is grown and source material is removed from the melt.

A pulling mechanism includes a pull shaft 37 extending down from a mechanism (not shown) capable of raising, lowering and rotating the pull shaft. The crystal puller 23 may have a pull wire rather than a shaft, depending upon the type of puller. The pull shaft 37 terminates in a seed crystal chuck 39 which holds a seed crystal 41 used to grow the monocrystalline ingot I. The pull shaft 37 has been partially broken away in FIG. 1 for clarity in illustration of a raised position of the seed chuck 39 and ingot I. The general construction and operation of the crystal puller 23, except to the extent explained more fully below, is well known to those of ordinary skill in the art and will not be further described.

Figure 2:
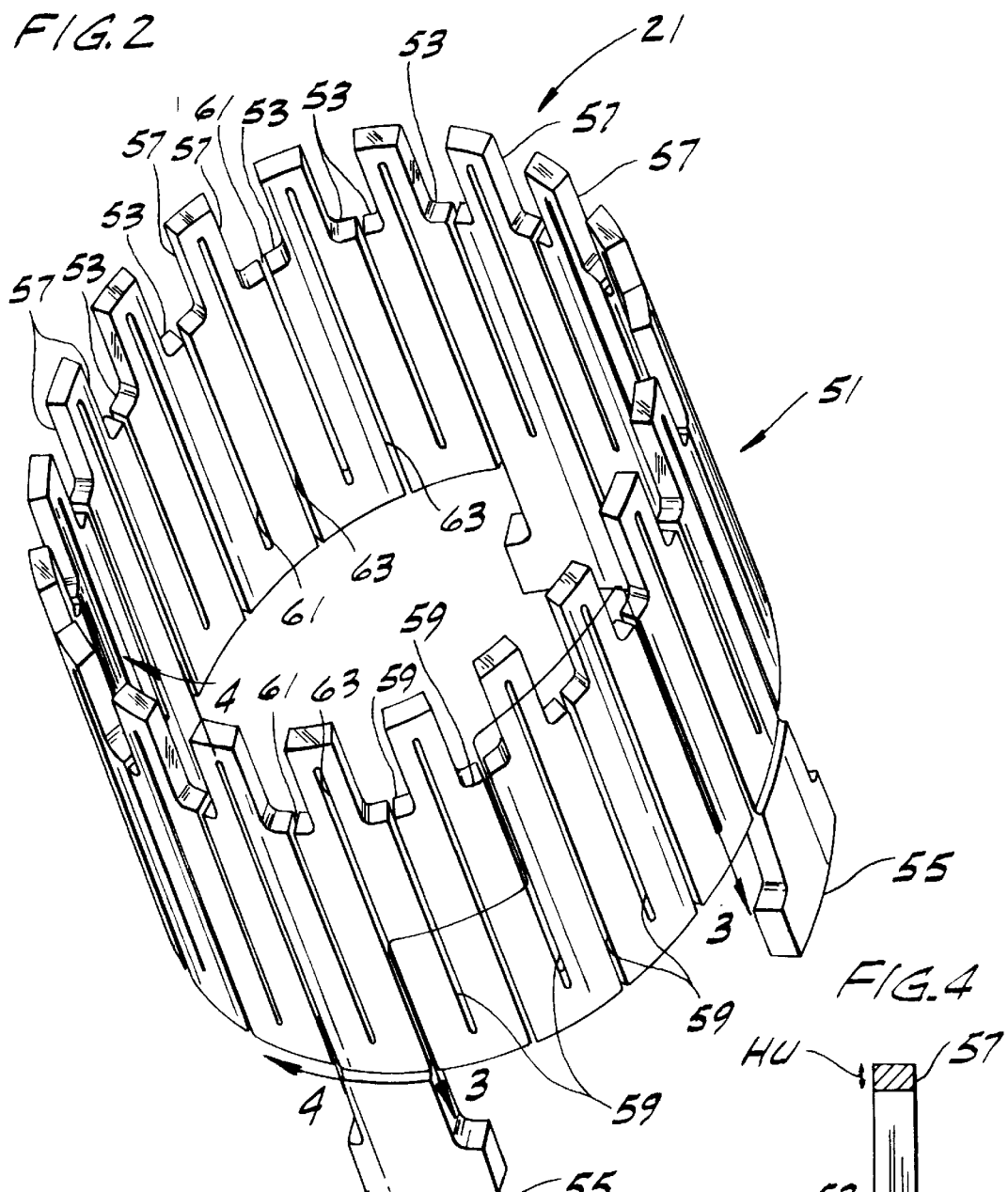
FIG. 2 is a perspective view of the electrical resistance heater of FIG. 1.

With reference to FIG. 2, the heater 21 used for melting the silicon in the crucible 31 comprises a generally cylindrical heating element, generally indicated at 51, sized for surrounding the outer surface of the crucible side wall 33. The heating element 51 comprises vertically oriented heating segments 53 arranged in side-by-side relationship and connected to each other in an electrical circuit. More particularly, the tops and bottoms of adjacent heating segments 53 are alternatingly connected to each other to define a continuous serpentine configuration about the entire heating element 51. Support legs 55 depend from the bottom of the heating element 51 in electrical connection with the heating segments 53 for mounting the heater 21 generally at the bottom of the housing in a conventional manner so that the heater of the present invention is interchangeable with crucible heaters currently installed in conventional crystal pullers. The support legs 55 are electrically connected to a source of electrical current (not shown) by conventional electrodes (not shown) for conducting current through the heating element 51.

The heating element S1 is constructed of a non-contaminating resistive heating material which provides resistance to the flow of electrical current therethrough; the power output generated by the heating element increasing with the electrical resistance of the material. A particularly preferred resistive heating material is highly purified extruded graphite. However, the heating element 51 may be constructed of isomolded graphite, silicon carbide coated graphite, carbon fiber composite or other suitable materials without departing from the scope of this invention.

As shown in FIG. 2, the heating segments 53 each comprise upper and lower sections 57, 59 connected to each other in an electrical circuit. In the illustrated embodiment, the upper and lower sections 57, 59 are formed as an integral unit. However, the upper sections 57 may be separate from the lower sections 59 and connected thereto by welding or other suitable fastening methods as long the connection forms an electrical circuit between the upper and lower sections. The lower sections 59 extend upward from the support legs 55 to the horizontal plane H defined in part by the melt surface of the molten source material M in the crucible 31. The upper sections 57 of the heating element 51 extend upward from the lower sections 59 adjacent the crucible side-wall 33 to a height substantially above the melt surface of the molten source material M. Both the upper and lower sections are generally rectangular in profile, with the upper sections having a width substantially smaller than the width of the lower sections so that the connection of each upper and lower sections defines a generally L-shaped shoulder of each heating segment.

In a preferred method of construction of the heating element 51, vertically extending slots 61, 63 are cut into a tube (not shown) constructed of the resistive heating material to define the serpentine configuration. Downward extending slots 61 extend down from the top of the heating element 51 and terminate short of the bottom of the heating element, between adjacent lower sections 59 of the segments 53, leaving adjacent lower sections connected to each other. Upward extending slots 63 extend up from the bottom of the heating element 51 and terminate short of the top of the heating element, intermediate adjacent upper sections 57 of the segments 53, leaving adjacent upper sections connected to each other. Alternating the downward and upward extending slots 61, 63 about the circumference of the heating element 51 creates the serpentine configuration of the heating element.

Figure 4:
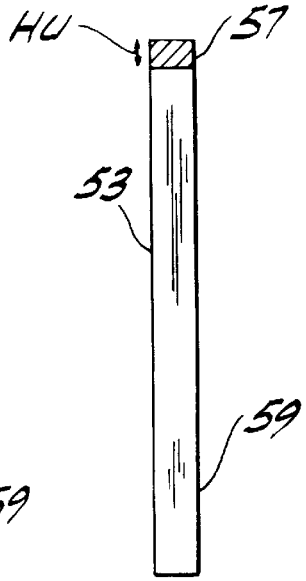
FIG. 4 is a section taken in the plane of line 4—4 of FIG. 2.
Figure 3:
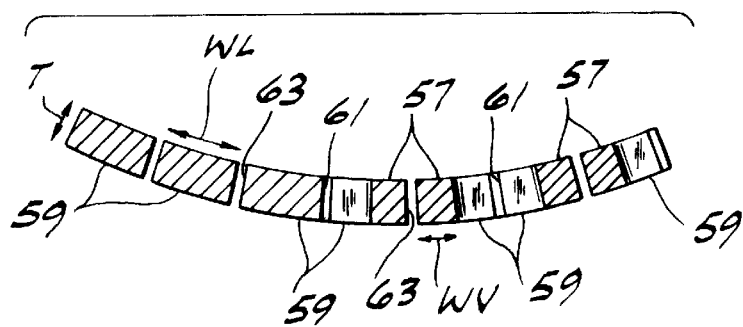
FIG. 3 is a section taken as indicated by line 3—3 of FIG. 2.

With reference to FIGS. 3 and 4, the thickness T of the upper and lower sections 57, 59 of the segments 53 is generally equal. However, the width WU of each upper section 57 is substantially less than the width WL of the corresponding lower section 59 so that the cross-sectional area of the upper section is less than the cross-sectional area of the lower section. Also, the height HU of the connection between adjacent upper sections 57 (e.g, the vertical distance between the top of the heating element S1 and the top of the upward extending slot 63) is substantially less than the width WL of the lower sections 59 so that the cross-sectional area of the connection is less than that of the lower sections. Preferably, the cross-sectional area of the connection between adjacent upper sections 57 is no greater than the cross-sectional area of the upper sections so that the cross-sectional area of the heating element segments 53 is generally constant above the lower sections 59 of the segments.

As an example, the thickness T of each upper and lower section 57, 59 of the illustrated embodiment is approximately 25 mm. Each lower section 59 has a width WL of about 55 mm and a cross-sectional area of about 1375 mm$^2$, while each upper section 57 has a width WU of about 23 mm and a cross-sectional area of about 575 mm$^2$. The cross-sectional area of the heating element 51 at the connection between adjacent upper sections 57 is preferably substantially equal to the cross-sectional area of the upper section (i.e., approximately 575 mm$^2$) so that the cross-sectional area (and hence the resistance) is relatively uniform throughout the upper sections and the connection therebetween. Thus, the cross-sectional area of the upper sections 57 and connection therebetween is everywhere less than the cross-sectional area of the lower sections 59 of the segments 53. The reduced cross-sectional area above the lower sections 59 increases the electrical resistance near the top of the heating element 51, thereby increasing the heating power in the upper sections 57 of the heating element with respect to the heating power generated by the lower sections.

In operation, polycrystalline silicon ("polysilicon") is deposited in the crucible 31 and electrical current is charged to the heating element 51 of the heater 21 to generate sufficient heat for melting the silicon in the crucible. A seed crystal 41 is brought into contact with the molten silicon and a single crystalline ingot I is grown by slow extraction via the crystal puller 23. During growth of the ingot, the increased electrical resistance in the upper sections 57 of the heating element segments 53 generates increased heating power in the upper sections. This increased heating power is sufficient to overcome the cooling effects of the crystal puller housing to provide a generally uniform temperature gradient throughout the height of the heating element 51. With the upper sections 57 extending slightly above the melt surface or horizontal plane H, the increased heating power generated by the upper sections inhibits cooling of the crucible side-wall 33 above the melt surface, thereby reducing the radiative cooling of the ingot at the melt surface.

As expected, reduced cooling of the crucible above the melt surface reduces cooling of the outer surface of the growing ingot I at the liquid-solid interface. The differential between the axial temperature gradients at the outer surface B of the ingot and the central axis A of the ingot is thus reduced, thereby decreasing the number of grown-in point defects upon solidification of the ingot.

As the crystal ingot I continues to grow and the amount of source material M in the crucible 31 decreases, the crucible is raised with respect to the heating element 51 and housing 25 to maintain the surface of the molten source material M at the same level H in the housing. Therefore, even though the crucible side-wall 33 moves relative to the upper sections 57 of the heating element 51, the upper sections remain slightly above the melt surface in the crucible to maintain heating of the crucible wall immediately above the melt surface.

As an example, a finite element analysis was conducted to simulate the growth of a pair of monocrystalline silicon ingots I according to the Czochralski method in a crystal puller 23 of the type described above. A conventional heater (not shown) was used in the crystal puller 23 to simulate the growth of the first ingot I and a profiled heater 21 of the present invention was used in the crystal puller to simulate the growth of the second ingot. During crystal growth, the axial temperature gradient was recorded at the liquid-solid interface for both the central axis (denoted A in FIG. 1) of the crystal and the outer surface (denoted B in FIG. 1) of the crystal. The crucible side-wall 33 temperature was analyzed at the melt surface (denoted C in FIG. 1) and the upper corner of the crucible (denoted D in FIG. 1).

The axial temperature gradients at the central axis A and outer surface B of the crystal ingot I were respectively 19.32° C./mm and 34.95° C./mm for the crystal grown using the conventional heater. Thus, the cooling rate at the outer surface of the crystal was substantially greater than the cooling rate at the central axis of the crystal. The ratio of outer surface axial temperature gradient to central axis axial temperature gradient (e.g., B/A) was 1.81. When using the profiled heater 21 of the present invention, the axial temperature gradient at the central axis of the crystal was calculated to be 17.9° C./mm and the axial temperature gradient at the outer surface of the crystal was calculated to be 26.3° C./mm. The ratio of outer surface axial temperature gradient to central axis axial temperature gradient (e.g., B/A) was thus reduced to 1.47.

With respect to the crucible wall temperature, the temperature of the upper corner D of the crucible wall 33 was about 1191° C. with the conventional heater and was increased to about 1209° C. when the profiled heater 21 was used. Thus, the profiled heater 21 of the present invention successfully increased the temperature of the cooling of the crucible wall 33 in the finite elements model. As a result, the net radiative heat transfer from the ingot I to the wall 33 of the crucible 31 is reduced.

It will be observed from the foregoing that the electrical resistance heater 21 described herein satisfies the various objectives of the present invention and attains other advantageous results. Providing a profiled heating element 51 in which the heating segments 53 have upper and lower sections 57, 59 of generally constant thickness T maintains the structural integrity of the heating element against bending stresses, thereby reducing the risk of fracture. Such bending stresses are induced during cutting of the slots, by the magnetic field created by cross-magnets used in the crystal puller 23 and by the weight of the heating element. Providing a generally constant cross-sectional area of the upper sections 57 of the heating element segments 53 further reduces the risk of fracture by creating a wider, more stable connection between the upper and lower sections of each segment. Maintaining the upper section thickness T while decreasing the width WU of the upper section 57 relative to the lower section 59 also reduces the cross-sectional area of the heating element 51, thereby increasing the electrical resistance at the top of the heating element 51 to increase the heating power of the heating element at the top of the heater 21. This inhibits the formation of temperature gradients along the height of the heating element 51, providing a more isothermal heater 21 that efficiently uses the current supplied to the heater by the source of electrical current.

The increased power output at the top of the heater 21 heats the crucible side-wall 33 above the melt surface to reduce the cooling effects of the crucible 31 on the growing ingot I. This results in a decreased temperature gradient differential between the outer surface B of the ingot I and the center A of the ingot at the liquid-solid interface.

In addition, the increased heating of the crucible side-wall 33 reduces the axial temperature gradients along the outer surface of the crucible side-wall. Since heat from the crucible is generally transmitted directly to the susceptor, the temperature gradient of the susceptor is therefore more uniform, resulting in an increased structural lifetime of the susceptor.

As various changes could be made in the above constructions without departing from the scope of the invention, it is intended that all matter contained in the above description or shown in the accompanying drawings shall be interpreted as illustrative and not in a limiting sense.

What is claimed is:

1. An electrical resistance heater for use in a crystal puller used for growing monocrystalline silicon ingots according to the Czochralski method, the crystal puller having a housing, a crucible in the housing for containing molten silicon and a pulling mechanism for pulling a growing ingot upward from the molten silicon, the heater comprising a heating element sized and shaped for disposition in the housing of the crystal puller around the crucible for applying heat to the crucible and silicon therein, the heating element including heating segments connected together in an electric circuit, the segments having upper and lower sections and being arranged relative to each other so that when disposed around the crucible containing molten silicon the upper sections are disposed generally above a horizontal plane including the surface of the molten silicon and the lower sections are disposed generally below the horizontal plane, the upper sections being constructed to generate more heating power than the lower sections thereby to reduce a temperature gradient between the molten silicon at its surface and the ingot just above the surface of the molten silicon, the upper sections having a thickness substantially equal to the thickness of the lower sections and having a width substantially less than the width of the lower sections, the cross-sectional area of the upper sections being everywhere less than the cross-sectional area of the lower sections.

2. A heater as set forth in claim 1 wherein the segments of the heating element are connected together in a serpentine configuration wherein each upper section is connected to an adjacent upper section and each lower section is connected to an adjacent lower section, the connection between adjacent upper sections having a cross-sectional area substantially less than the cross-sectional area of the lower sections.

3. A heater as set forth in claim 2 wherein the cross-sectional area of the connection between adjacent upper sections is no greater than the cross-sectional area of the upper sections.

4. A heater as set forth in claim 1 wherein the cross-sectional area of each upper section is everywhere substantially constant.

5. A heater as set forth in claim 1 wherein each upper section extends upwardly from a corresponding lower section, the intersection of the upper section with the lower section defining a generally L-shaped shoulder of the heating segment.

6. An electrical resistance heater for use in a crystal puller used for growing monocrystalline silicon ingots according to the Czochralski method, the crystal puller having a housing, a crucible in the housing for containing molten silicon and a pulling mechanism for pulling a growing ingot upward from the molten silicon, the heater comprising a heating element sized and shaped for disposition in the housing of the crystal puller around the crucible for applying heat to the crucible and silicon therein, the heating element including heating segments connected together in an electric circuit, the segments having upper and lower sections and being arranged relative to each other so that when disposed around the crucible containing molten silicon the upper sections are disposed generally above a horizontal plane including the surface of the molten silicon and the lower sections are disposed generally below the horizontal plane, the upper sections being constructed to generate more heating power than the lower sections thereby to reduce a temperature gradient between the molten silicon at its surface and the ingot just above the surface of the molten silicon, the upper sections having a thickness substantially equal to the thickness of the lower sections and having a width substantially less than the width of the lower sections, the cross-sectional area of the upper sections being everywhere less than the cross-sectional area of the lower sections, connection of the heating segments defining a serpentine configuration having circumferentially alternating upward extending slots and downward extending slots spacing unconnected portions of the heating segments, the upward extending slots extending substantially from the bottom of the heating element up to connected upper sections of adjacent heating segments, the downward extending slots extending substantially from the top of the heating element down to connected lower sections of adjacent heating segments, at least a portion of each downward extending slot having a width substantially greater than the width of each upward extending slot.

7. An electrical resistance heater as set forth in claim 6 wherein the said at least a portion of each downward extending slot spaces unconnected upper sections of adjacent heating segments.

8. An electrical resistance heater as set forth in claim 6 wherein the upward extending slots have a substantially constant width.

9. A heater as set forth in claim 6 wherein the cross-sectional area of the connection between adjacent upper sections is no greater than the cross-sectional area of the upper sections.

10. A heater as set forth in claim 6 wherein the cross-sectional area of each upper section is everywhere substantially constant.

11. A heater as set forth in claim 6 wherein each upper section extends upwardly from a corresponding lower section, the intersection of the upper section with the lower section defining a generally L-shaped shoulder of the heating segment.

* * * * *